United States Patent [19]

Sunderland

[11] 4,400,652
[45] Aug. 23, 1983

[54] MAGNETIC DEFLECTION SWEEP AMPLIFIER WITH INTELLIGENT FLYBACK

[75] Inventor: Richard A. Sunderland, Aloha, Oreg.
[73] Assignee: Squibb Vitatek, Inc., Hillsboro, Oreg.
[21] Appl. No.: 373,834
[22] Filed: May 3, 1982
[51] Int. Cl.³ .................. H01J 29/70; H01J 29/72
[52] U.S. Cl. .................. 315/387; 315/403; 315/408
[58] Field of Search .............. 315/387, 388, 403, 408

[56] References Cited

U.S. PATENT DOCUMENTS 3,659,115  4/1972  Montgomery ............... 315/403
4,242,714  12/1980  Yoshida et al. ............... 315/371
4,302,708  11/1981  Spilsbury ................... 315/388

Primary Examiner—Theodore M. Blum
Attorney, Agent, or Firm—Lawrence S. Levinson; Sanford J. Asman

[57] ABSTRACT

The magnetic deflection sweep amplifier includes a first switch, such as a MOSFET in series with a deflection yoke. The switch is controlled by a second switch, such as a bipolar transistor, and the second switch is able to selectively control the first switch, whereby the yoke current can be reversed, to provide complete flyback, or can be truncated part way through flyback to stop the retrace at an intermediate position. The flyback amplifier also has provision for linear operation without flyback. The present invention accomplishes the foregoing with very few parts and with very little power consumption.

9 Claims, 2 Drawing Figures

NO FLYBACK    PARTIAL FLYBACK    COMPLETE FLYBACK

VOLTAGE AT POINT A

MAGNETIC DEFLECTION SWEEP AMPLIFIER WITH INTELLIGENT FLYBACK

BACKGROUND OF THE INVENTION

The present invention relates to a horizontal magnetic deflection linear amplifier of the type used in cathode ray tube (CRT) display systems.

A "flyback circuit" is a series resonant magnetic deflection circuit used to direct the position of the electron beam in a CRT. Such circuits provide a fast retrace of the electron beam from one side of the CRT to the opposite, "mirror image" position in one half cycle of oscillation, as determined by the yoke and flyback capacitor. They also have the advantage of consuming low power for the high retrace speeds they achieve. In a raster scan display system, such as a conventional television receiver, a flyback circuit is typically used to move the electron beam from the end of one line to the beginning of the next succeeding line. In a non-raster scan CRT system, such as a directed beam system, flyback is typically not used, because the electron beam is typically directed from one point to the next point, and the likelihood of movement between mirror image locations is not great. Thus, a typical directed beam CRT display system gives up the speed and power advantages of flyback.

Non-raster scan magnetically deflected CRT systems are often used in data display apparatus, such as patient monitors. In such systems, there are often a plurality of waveforms or other data displayed simultaneously on the CRT. In order to allow a single electron beam to produce the maximum brightness of the displayed data, the "off" time of the electron beam should be minimized. It is, therefore, desirable to be able to move the beam from point to point as quickly as possible. While a flyback technique is faster than linear movement for equal power consumption in the deflection circuits, it has heretofore been impossible to employ a flyback circuit in a CRT display system to produce a movement of the electron beam to a position other than its "mirror image" position.

It would be desirable to have a flyback circuit which could return to a position other than its mirror image position. It would also be advantageous to have a flyback circuit which could also operate in a linear, i.e., a non-flyback manner, when no flyback is required or possible.

SUMMARY OF THE INVENTION

The present invention is a magnetic deflection circuit for a CRT display. The invention comprises an amplifier having an input and an output. An inductive yoke, having two terminals, receives an input signal from the output of the amplifier at one of its terminals. A capacitor is connected to the other terminal of the yoke, and the other side of the capacitor is connected to means for returning the output signal to the input of the amplifier. Typically, the means for returning the output signal is a resistor. The invention further comprises means for sensing the current flow through the yoke and switch means for selectively shorting the capacitor, the switch means, which is a MOSFET in the preferred embodiment of the invention, has a low resistance state and a high resistance state. A diode is connected across the switch means to permit unidirectional current flow when the switch means is in its high resistance state. The invention also comprises control means for selectively controlling the switch means in response to the output voltage of the amplifier. The control means places the switch means into its high resistance state when the desired yoke current has a value, relative to the actual yoke current, such that the diode does not permit current flow, i.e., when the diode is reverse biased.

DETAILED DESCRIPTION OF THE PREFERRED EMBODIMENT

Figure 1:
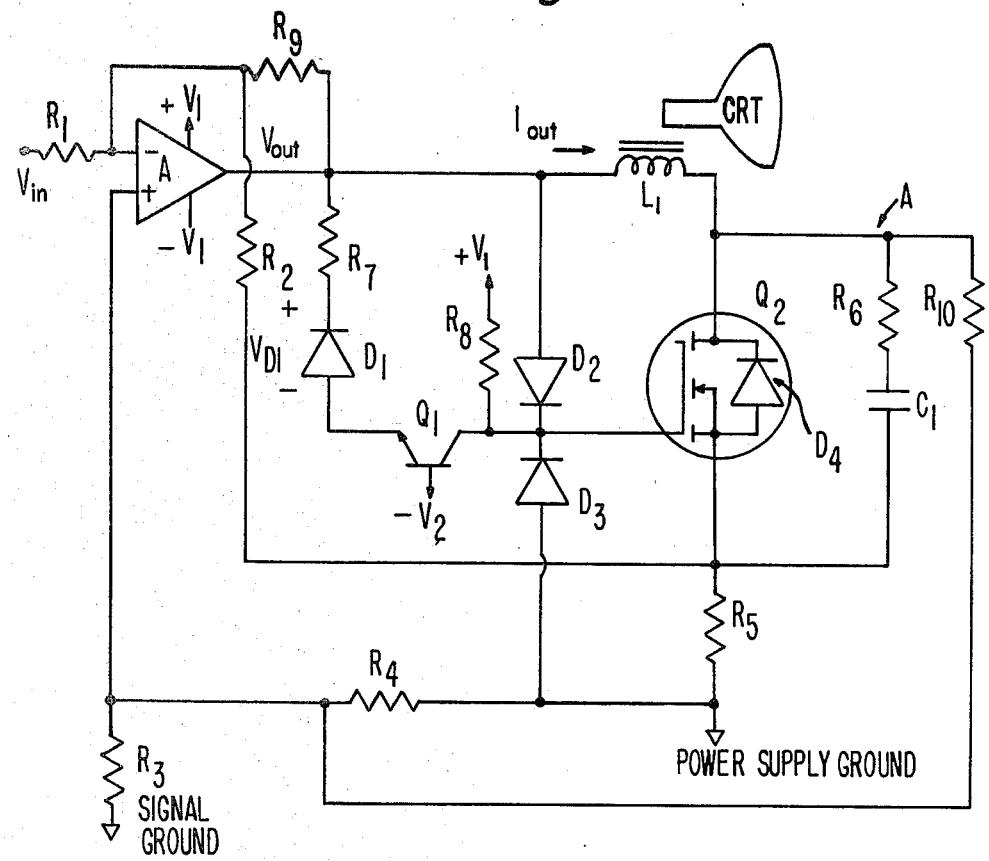
FIG. 1 is a schematic diagram of the circuit of the preferred embodiment of the invention.

Referring to FIG. 1, a schematic diagram of the circuit of the preferred embodiment of the present invention is shown. In accordance with the schematic diagram, an input voltage, $V_{in}$, is input to an amplifier, such as power operational amplifier (Op Amp) A, through an input resistor $R_1$.

$R_5$ is the yoke current-sensing resistor, and the voltage across it (which is proportional to yoke current) is coupled to the input of power Op Amp A. The value of $R_5$, together with the ratio of $R_2/R_1$, set the transconductance ($i_{out}/V_{in}$) of the circuit. For $V_{out}$ greater than $-V_2-V_{D1}-V_{BE1}$ (where $V_{D1}$ is the voltage drop across diode $D_1$ and $V_{BE1}$ is the base-emitter drop of transistor $Q_1$), transistor $Q_1$ is off. Resistor $R_8$ keeps transistor $Q_2$ on which effectively shorts out the series combination of $R_6$ and $C_1$. Under these conditions, operation is controlled solely by $V_{out}$, with current-based feedback.

When the yoke current ($i_{out}$) is negative-going and the slew rate of $V_{in}$ is fast enough to cause $V_{out}$ to go sufficiently below $-V_2$, i.e., low enough to pull sufficient current through the emitter of transistor $Q_1$, the collector voltage of transistor $Q_1$ pulls the gate of transistor $Q_2$ down until, transistor $Q_2$ turns off. Circuit operation now depends on the polarity of $i_{out}$ in the yoke.

In the preferred embodiment of the invention, $Q_2$ is an International Rectifier IRF 630 MOSFET. This MOSFET has an internal diode shown schematically as $D_4$. Other N-channel MOSFETs could be used. However, if another MOSFET is substituted, and the substituted device does not include an internal diode equivalent to $D_4$, then an external diode must be added to the circuit to replace $D_4$.

If $i_{out}$ is negative, deflection, i.e. yoke current continues to be determined solely by $V_{out}$, with $D_4$ providing a path to ground (through $R_5$) for $i_{out}$.

If $i_{out}$ is positive, $i_{out}$ must flow from the yoke to ground through $R_6$, $C_1$, and $R_5$. $R_6$ and $C_1$ form a series resonant circuit with $L_1$ (the yoke). If transistor $Q_2$ stays off, the voltage across $C_1$ will be the positive half of a sine wave of frequency $(2\pi L_1 C_1)^{-\frac{1}{2}}$, and $i_{yoke\ final} = -i_{yoke\ initial}$ (discounting losses). Using a small value capacitor for $C_1$ makes this happen quite rapidly. The voltage at point A goes quite high, because $C_1$ must store the energy $CV^2/2$ which was in the yoke $I^2L/2$.

Notice however, that Op Amp A continues to monitor $i_{out}$ during flyback, and the voltage across $R_5$ continues to be proportional to yoke current.

Figure 2:
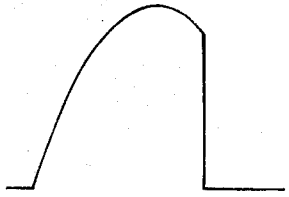
FIG. 2 is an illustration of the waveforms present at point A on the schematic diagram when no flyback, partial flyback, and complete flyback are required.
Figure 2:
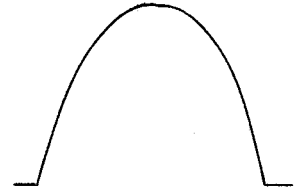

If the change in $V_{in}$ dictates backing up the sweep only part way, then $V_{out}$ will swing positive and shut off transistor $Q_1$ when $i_{out}$ crosses the desired value. $R_8$ then pulls the gate of transistor $Q_2$ high, turning it on. $D_2$ speeds up the process by reducing effects of parasitic drain-to-source capacitance in $Q_2$. $Q_2$ immediately pulls point A close to ground, thus truncating the flyback, as shown in FIG. 2, and discharging $C_1$ through $R_6$.

The present invention provides flyback in a linear, magnetic deflection amplifier. It also provides for automatic truncation of flyback during partial retrace, and it allows for continuous monitoring of $i_{out}$ during any deflection condition.

One of the most important features of the present invention is its tremendous display capability. When combined with a vertical deflection system of appropriate speed, it can display a number of waveforms simultaneously with many numeric readouts on the CRT. For example, the present system can display four waveforms, together with numeric readouts, without visible flicker, at a 50 Hz frame rate. To do all of this without the present invention would require more parts, more power, and would probably have lower reliability.

In order to prevent the circuit from oscillating due to the presence of the yoke in the feedback loop, negative feedback of $V_{out}$ (yoke voltage) at high frequencies is required. A conventional (i.e. non-flyback) magnetic deflection circuit often provides such feedback by placing a resistor of several hundred ohms across the yoke and allowing resistor divider action with a resistor that senses yoke current to inject a small signal through a current feedback resistor to the amplifier. The conventional scheme could be used in the present invention by removing $R_9$ and adding a new resistor of several hundred ohms between $V_{out}$ and the upper end of $R_5$. Because of the resistance involved, however, noticeable power could be dissipated by the new resistor at high frequencies where the voltage across it is significant.

The present invention uses $R_9$, which typically has a value on the order of hundreds of kilohms, to accomplish damping. $R_9$ does not need to have as low a value as the alternative described above (since $R_9$ doesn't rely upon affecting the voltage across $R_5$—a very low value resistor) to accomplish feedback. $R_9$ can be several orders of magnitude larger in resistance, hence dissipating much less power since the voltage across it is essentially the same as its alternative.

$R_{10}$ is a resistor which provides a short settling time during partial flyback, a condition which requires very fast response from Op Amp A when the intended yoke current is reached. $R_{10}$ allows the Op Amp to "anticipate" when it will have to start slewing $V_{out}$ in order to accomplish turning $Q_2$ on in time to halt yoke current at the desired value with no overshoot. It does this by providing the Op Amp with an error signal proportional to the yoke current slew rate during flyback. That allows the Op Amp to start slewing its output prior to the time the proper $i_{out}$ is achieved. $R_{10}$ thereby causes the Op Amp to react earlier for faster yoke current slew rates so that the truncation of the flyback occurs on time.

I claim:

1. A magnetic deflection circuit for a CRT display comprising:
   (a) an amplifier having an input and an output;
   (b) an inductive yoke which receives at one terminal an input signal from the output of said amplifier;
   (c) a capacitor connected to the other terminal of said yoke, the other side of said capacitor being connected to means for returning the output signal to said input of said amplifier;
   (d) means for sensing the current flow through said yoke;
   (e) switch means for selectively shorting said capacitor, said switch means having a low resistance state and a high resistance state; and
   (f) a diode connected across said switch means, said diode permitting unidirectional current flow when said switch means is in its high resistance state; and
   (g) control means for selectively controlling said switch means in response to the output voltage of said amplifier, said control means placing said switch means into its high resistance state when the desired yoke current has a value, relative to the actual yoke current, such that said diode does not permit current flow.

2. The magnetic deflection circuit of claim 1 wherein said amplifier has two differential inputs, one of which receives an input voltage signal, said circuit further comprising anticipation means for causing the voltage of the output of the amplifier to anticipate the truncation time of flyback, said anticipation means comprising an anticipation resistor having one terminal connected to the junction of said switch means and said yoke, said anticipation resistor having its other terminal connected to the differential input terminal of the amplifier which the input voltage signal is not connected to.

3. The magnetic deflection circuit of claim 1 wherein said amplifier is a differential input operational amplifier.

4. The magnetic deflection circuit of claim 1 wherein said switch means comprises a MOSFET.

5. The magnetic deflection circuit of claim 4 wherein said diode connected across said switch means is an internal diode within said MOSFET.

6. The magnetic deflection circuit of claim 4 wherein said MOSFET does not comprise an internal diode and said diode connected across said switch means is a discrete diode connected between the source and drain of said MOSFET.

7. The magnetic deflection circuit of claim 1 wherein said control means for selectively controlling said switch means in response to the output voltage of said amplifier comprises a transistor.

8. The magnetic deflection circuit of claim 7 wherein said transistor comprising said control means for selectively controlling said switch means in response to the output voltage of said amplifier is a bipolar transistor whose output is connected to said switch means.

9. The magnetic deflection circuit of claim 8 wherein said switch means comprises a MOSFET and the output of said bipolar transistor is connected to the gate of said MOSFET.

* * * * *

UNITED STATES PATENT AND TRADEMARK OFFICE
CERTIFICATE OF CORRECTION

PATENT NO. : 4,400,652

DATED : August 23, 1983

INVENTOR(S) : Richard A. Sunderland

It is certified that error appears in the above–identified patent and that said Letters Patent are hereby corrected as shown below:

Col. 2, line 35, "current-based" should read -- current-sensed --

Signed and Sealed this

Twenty-fifth Day of October 1983

[SEAL]

Attest:

GERALD J. MOSSINGHOFF

Attesting Officer

Commissioner of Patents and Trademarks